US007007264B1

(12) United States Patent
Baxter

(10) Patent No.: US 7,007,264 B1
(45) Date of Patent: Feb. 28, 2006

(54) SYSTEM AND METHOD FOR DYNAMIC RECONFIGURABLE COMPUTING USING AUTOMATED TRANSLATION

(75) Inventor: Michael A. Baxter, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 346 days.

(21) Appl. No.: 10/428,373

(22) Filed: May 2, 2003

(51) Int. Cl.
G06F 17/50 (2006.01)
G06F 9/24 (2006.01)
G06F 9/445 (2006.01)
H03K 19/173 (2006.01)

(52) U.S. Cl. .............................. 716/18; 716/16; 716/3; 716/7; 708/231; 708/232; 709/221; 709/222; 326/38; 713/2; 713/100

(58) Field of Classification Search ................ 716/18, 716/16, 3, 7; 708/231, 232; 709/221, 222, 709/338, 200; 326/38; 713/2, 100
See application file for complete search history.

(56) References Cited

U.S. PATENT DOCUMENTS

| 5,857,109 | A  | * | 1/1999  | Taylor ........................ 712/37 |
| 6,026,481 | A  | * | 2/2000  | New et al. .................... 712/43 |
| 6,226,776 | B1 | * | 5/2001  | Panchul et al. ................ 716/3 |
| 6,324,680 | B1 | * | 11/2001 | Barnfield et al. ............. 716/18 |
| 6,477,683 | B1 | * | 11/2002 | Killian et al. ................. 716/1 |
| 6,615,167 | B1 | * | 9/2003  | Devins et al. ................ 703/28 |
| 6,678,645 | B1 | * | 1/2004  | Rajsuman et al. ............ 703/20 |
| 6,701,501 | B1 | * | 3/2004  | Waters et al. .................. 716/8 |
| 6,735,756 | B1 | * | 5/2004  | Linn et al. .................... 716/16 |
| 6,754,882 | B1 | * | 6/2004  | Sanchez et al. .............. 716/16 |
| 6,760,898 | B1 | * | 7/2004  | Sanchez et al. .............. 716/16 |
| 6,803,786 | B1 | * | 10/2004 | Bilski et al. .................. 326/41 |
| 6,820,248 | B1 | * | 11/2004 | Gan .............................. 716/17 |
| 6,826,717 | B1 | * | 11/2004 | Draper et al. ................. 714/39 |
| 6,862,563 | B1 | * | 3/2005  | Hakewill et al. ............. 703/14 |
| 6,912,706 | B1 | * | 6/2005  | Stamm et al. ................ 716/17 |
| 6,920,627 | B1 | * | 7/2005  | Blodget et al. ............... 716/17 |
| 6,934,922 | B1 | * | 8/2005  | Burnley .......................... 716/6 |
| 6,941,538 | B1 | * | 9/2005  | Hwang et al. ................ 716/16 |
| 2001/0020251 | A1 | * | 9/2001  | Sheikh et al. ............... 709/224 |
| 2002/0194236 | A1 | * | 12/2002 | Morris ....................... 708/403 |
| 2003/0163798 | A1 | * | 8/2003  | Hwang et al. ................ 716/16 |
| 2004/0073882 | A1 | * | 4/2004  | Osann, Jr. ..................... 716/16 |
| 2004/0123258 | A1 | * | 6/2004  | Butts .............................. 716/5 |

(Continued)

FOREIGN PATENT DOCUMENTS

EP         316549 A2 *  5/1989

(Continued)

OTHER PUBLICATIONS

Alston et al., "From C to Netlists: Hardware Engineering for Software Engineers?", Electronics and Communication Engineering Journal, vol. 14, No. 4, Aug. 2002, pp. 165-173.*

(Continued)

Primary Examiner—Matthew Smith
Assistant Examiner—Phallaka Kik
(74) Attorney, Agent, or Firm—Pablo Meles; LeRoy D. Maunu; Justin Liu

(57) ABSTRACT

A system (20) for dynamic reconfigurable computing includes at least one microprocessor implemented on a field programmable gate array (10) having a programmable fabric (12). The system can include a predefined interface (42) between an embedded microprocessor and the programmable fabric as well as a translator (25) enabling a single hardware description language to define the system including both the microprocessor and the programmable fabric.

19 Claims, 3 Drawing Sheets

U.S. PATENT DOCUMENTS

| | | | |
|---|---|---|---|
| 2004/0139411 A1 * | 7/2004 | Smith et al. | 716/7 |
| 2004/0210592 A1 * | 10/2004 | Ciolfi et al. | 707/101 |
| 2004/0210855 A1 * | 10/2004 | Sanchez et al. | 716/1 |
| 2004/0225992 A1 * | 11/2004 | Sanchez et al. | 716/16 |
| 2004/0250231 A1 * | 12/2004 | Killian et al. | 716/18 |
| 2005/0183045 A1 * | 8/2005 | Hwang et al. | 716/1 |
| 2005/0193358 A1 * | 9/2005 | Blodget et al. | 716/17 |

FOREIGN PATENT DOCUMENTS

| | | | |
|---|---|---|---|
| EP | 973095 A1 * | 1/2000 | |
| JP | 01161469 A * | 6/1989 | |
| JP | 02176882 A * | 7/1990 | |
| JP | 06149585 A * | 5/1994 | |
| JP | 09185557 A * | 7/1997 | |
| JP | 2000099361 A * | 4/2000 | |
| JP | 2000150781 A * | 5/2000 | |
| WO | WO 3034199 A2 * | 4/2003 | |

OTHER PUBLICATIONS

Diepenhorst et al., "Automatic Generation of VHDL Code for Neural Applications", International Joint Conference on Neural Networks, vol. 4, Jul. 10, 1999, pp. 2302-2305.*

Agun et al., "Design of a Reusable Memory Management", 2001 Proceedings of 14th Annual IEEE International ASIC/SOC Conference, Sep. 12, 2001, pp. 369-373.*

Tsai et al., "Processor-Programmable Memory BIST for Bus-Connected Embedded Memories", 2001 Proceedings of the ASP-DAC Asia and South Pacific Design Automation Conference, Jan. 30, 2001, pp. 325-330.*

Limin et al., "FPGA Hardware Devices with Single-Instruction Driving for an Embedded Mobile Computing Platform", 2001 Proceedings of 4th International Conference on ASIC, Oct. 23, 2001, pp. 514-517.*

Prasartsee et al., "FPGA-Based Climate Controller Design for Plant Tissue Culture Room", 2002 IEEE International Conference on Industrial Technology, vol. 2, Dec. 11, 2002, pp. 1349-1353.*

Chang, "Teaching Top-Down Design using VHDL and CPLD", 26th Annual Conference on Frontiers in Education Conference, vol. 2, Nov. 6, 1996, pp. 514-517.*

Buchholz et al., "Behavioral Emulation of Synthesized RT-Level Description using VLIW Architectures", Proceedings of 1998 Ninth International Workshop on Rapid System Prototyping, Jun. 3, 1998, pp. 70-75.*

Bang et al., "Design Optimization of Main-Profile MPEG-2 AAC Decoder", 2001 Proceedings of IEEE International Conference on Acoustics, Speech, and Signal Processing, vol. 2, May 7, 2001, pp. 989-992.*

* cited by examiner

SYSTEM AND METHOD FOR DYNAMIC RECONFIGURABLE COMPUTING USING AUTOMATED TRANSLATION

FIELD OF THE INVENTION

This invention relates generally to programmable logic devices, and more particularly to a method and system for automatically conjoining a field programmable gate array fabric with a microprocessor.

BACKGROUND OF THE INVENTION

Programmable devices are a class of general-purpose integrated circuits that can be configured for a wide variety of applications. Such programmable devices have two basic versions, mask programmable devices, which are programmed only by a manufacturer, and field programmable devices, which are programmable by the end user. In addition, programmable devices can be further categorized as programmable memory devices or programmable logic devices. Programmable memory devices include programmable read only memory (PROM), erasable programmable read only memory (EPROM) and electrically erasable programmable read only memory (EEPROM). Programmable logic devices include programmable logic array (PLA) devices, programmable array logic (PAL) devices, erasable programmable logic devices (EPLD), complex programmable logic devices (CPLD), and programmable gate arrays (PGAs) or field programmable gate arrays (FPGAs).

As chip capacity continues to increase significantly, the use of field programmable gate arrays (FPGAs) is quickly replacing the use of application specific integrated circuits (ASICs). An ASIC is a specialized integrated circuit that is designed for a particular application and can be implemented as a specialized microprocessor. In spite of including circuitry for being programmable, an FPGA has an extremely high density of electronic gates. This high gate density has contributed immensely to the popularity of FPGAS. FPGAs usually include user configurable input/output blocks (IOBs), and configurable logic blocks (CLBs) having configurable interconnects and switching capability.

The advancement of computer chip technology has also resulted in the development of embedded processors and controllers. An embedded processor or controller can be a microprocessor or microcontroller circuitry that has been integrated into an electronic device as opposed to being built as a standalone module or "plugin card." Advancement of FPGA technology has led to the development of FPGA-based system-on-chips (SoCs) including FPGA-based embedded processor SoCs. An SoC is a fully functional product having its electronic circuitry contained on a single chip. While a microprocessor chip requires ancillary hardware electronic components to process instructions, an SoC would include all required ancillary electronics on the same chip. For example, an SoC for a cellular telephone can include a microprocessor, encoder, decoder, digital signal processor (DSP), RAM, and ROM. It should be understood that within contemplation of the present invention an FPGA-based SoC does not necessarily include a microprocessor or microcontroller. For example, an SoC for a cellular telephone could include an encoder, decoder, digital signal processor, RAM and ROM that rely on an external microprocessor chip. An SoC could also include multiple processing modules coupled to each other via a bus or several busses. It should also be understood herein that "FPGA-based embedded processor SoCs" are a specific subset of FPGA-based SoCs that include their own processors.

In order for device manufacturers to develop FPGA-based SoCs or FPGA-based embedded processor SoCs, they must acquire intellectual property rights for system components and/or related technologies that are utilized to create the FPGA-based SoCs. These system components and/or technologies are called cores or Intellectual Property (IP) cores. An electronic file containing system component information can typically be used to represent the core. A device manufacturer will generally acquire several cores that are integrated to fabricate the SoC. More generically, the IP cores can form one or more of the processing modules in an FPGA-based SoCs. The processing modules can either be hardware or software based.

Notwithstanding advantages provided by using FPGA-based SoCs, the development of these SoCs can be very challenging. One of the challenges is communication among multiple hardware and software processors embedded in an FPGA-based SoC. Typically, such communication occurs over a bus. Unfortunately, the embedded processors in an FPGA-based SoC are each treated as a separate computer requiring the use of a C compiler and a runtime stack or a conventional heap data structure. Additionally, existing FPGA-based embedded processor SoCs would require several programming languages to specify the entire design system. In particular, a system may require both a high-level language and a hardware description language (HDL) to define the hardware in the FPGA for the system solution. Furthermore, such an existing system will require a Real Time Operation System (RTOS). FPGA-based embedded processor SoCs are being introduced into the market, but there are no solutions which allow users to customize the system, the hardware and software processing modules, and the associated software, nor is there a system enabling a user to trade off between implementing a function in hardware (FPGA fabric) or software (running on the embedded processor). It would be desirable to have a method and system for enabling dynamic reconfigurable computing using automated translation that does not necessarily require a C compiler, a runtime stack or conventional heap data structure, an RTOS, or multiple programming languages in FPGA-based SoCs, and that further overcome the shortcomings described above.

SUMMARY OF THE INVENTION

The present invention preferably uses automated microprogramming that enables the automatic translation of HDL into microprocessor assembly language programs. An exemplary system would automatically translate Verilog HDL into PowerPC assembly language. This automated translation would allow FPGAs users to employ conventional system engineering practices to attain automatic use of the embedded microprocessor (such as a PowerPC) without programming. In one embodiment, the user can automatically conjoin the FPGA fabric with the microprocessor via a predefined microprocessor/fabric interface. By having automatic translation of HDL to microprocessor assembly language that exchanges signals with the FPGA fabric, an easy-to-use at-runtime dynamically reconfigurable system architecture is achieved.

In a first aspect of the present invention, a system comprises an integrated circuit comprising a microprocessor and a field programmable gate array fabric, and a description language for programming both the microprocessor and the field programmable gate array fabric.

In a second aspect of the present invention, a method for dynamic reconfigurable computing of a system, having at least one microprocessor implemented on a field programmable gate array having a programmable fabric, comprises the steps of splitting hardware description language source code used in defining the system between source code for the programmable fabric and source code for the at least one microprocessor and automatically translating the source code for the at least one microprocessor to provide translated source code. The method further combines the translated source code with the source code from the programmable fabric to provide a combined source code.

Several enabling concepts allow the present invention to provide the advantages described herein. Firstly, the embedded microprocessor is treated as a logic element and not as a computer processing unit. Secondly, rather than having an automated partitioning, the user of the FPGA is able to define the partitioning of functions between hardware and software or between various hardware and software components that may be in a particular system architecture. Thirdly, a single programming language is preferably used to specify the entire system, ideally in Verilog HDL. A predefined microprocessor/fabric interface element and a "baremetal" runtime environment for the embedded processor round out the additional concepts enabling this easy-to-use dynamic reconfigurable architecture. As used herein, "baremetal" describes a starkly minimal computing and programming environment, where a machine program runs at a very low level. In contrast with conventional runtime environments, a baremetal environment, for instance, lacks a runtime stack, a runtime heap, linked libraries, and an operating system, and requires a fixed amount of runtime memory.

DETAILED DESCRIPTION OF THE DRAWINGS

Figure 1:
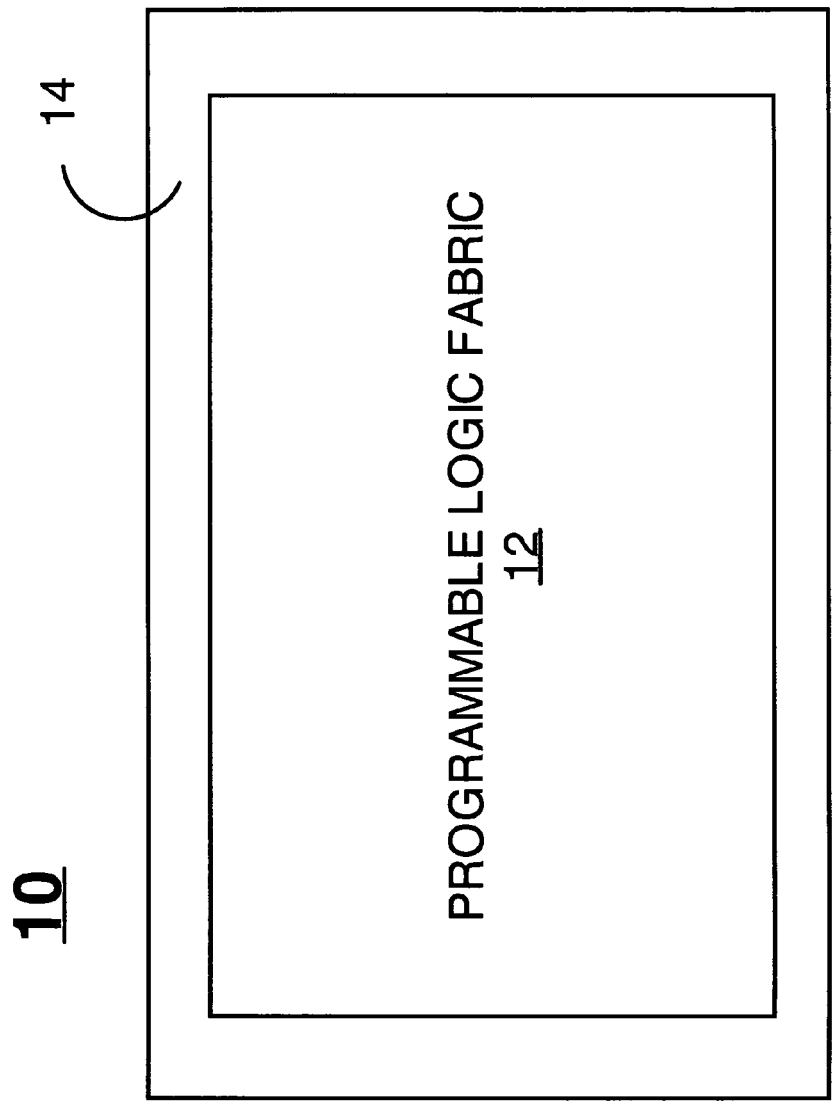
FIG. 1 illustrates a schematic block diagram of a prior art field programmable gate array.

Field programmable gate arrays (FPGA) have become popular for telecommunication applications, Internet applications, switching applications, routing applications, and a variety of other end user applications. FIG. 1 illustrates a generic schematic block diagram of a field programmable gate array (FPGA) 10. FPGA 10 includes programmable logic fabric 12 (containing programmable logic gates and programmable interconnects) and programmable input/output blocks 14. The programmable input/output blocks 14 are fabricated integrally with the FPGA 10 and are coupled to the pins of the integrated circuit, allowing users to access the programmable logic fabric 12. The programmable logic fabric 12 can be programmed to perform a wide variety of functions corresponding to particular end user applications, and can be implemented in a variety of ways.

Figure 2:
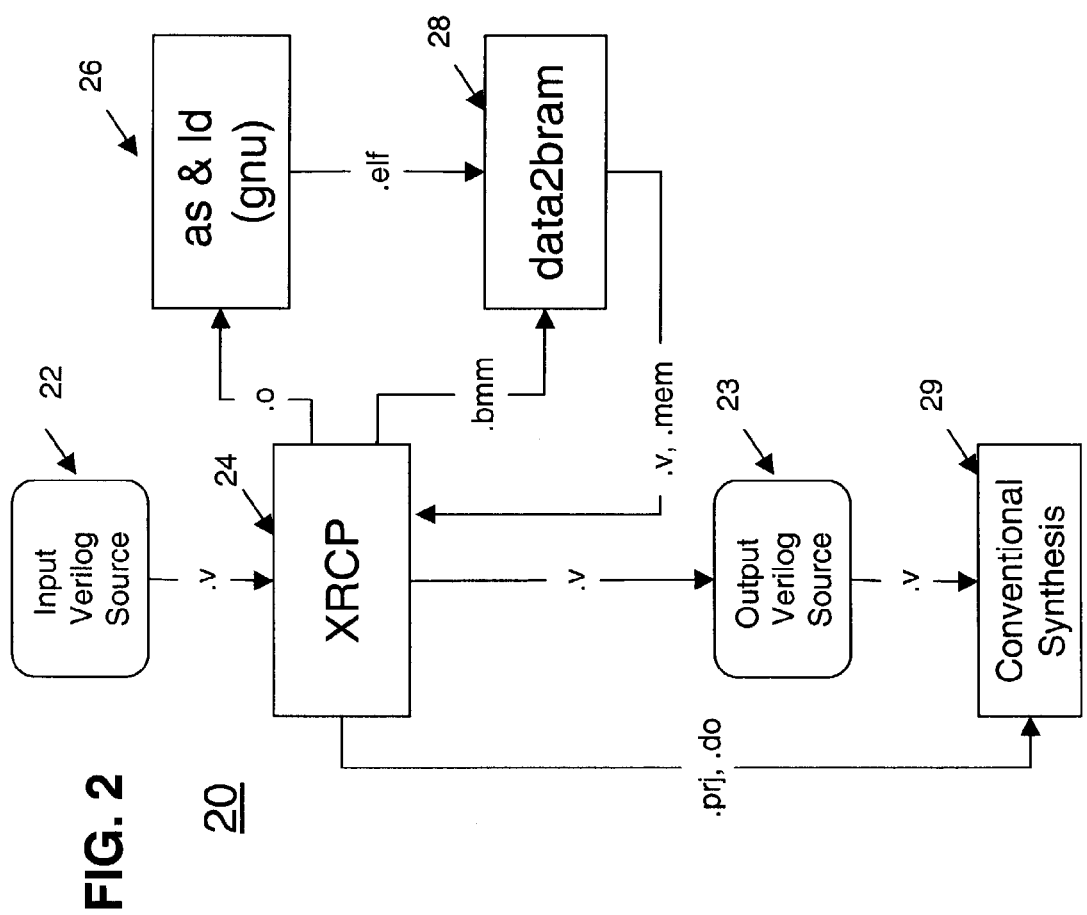
FIG. 2 depicts an exemplary block diagram of a system for dynamic reconfigurable computing using automated translation in accordance with the inventive arrangements.
Figure 3:
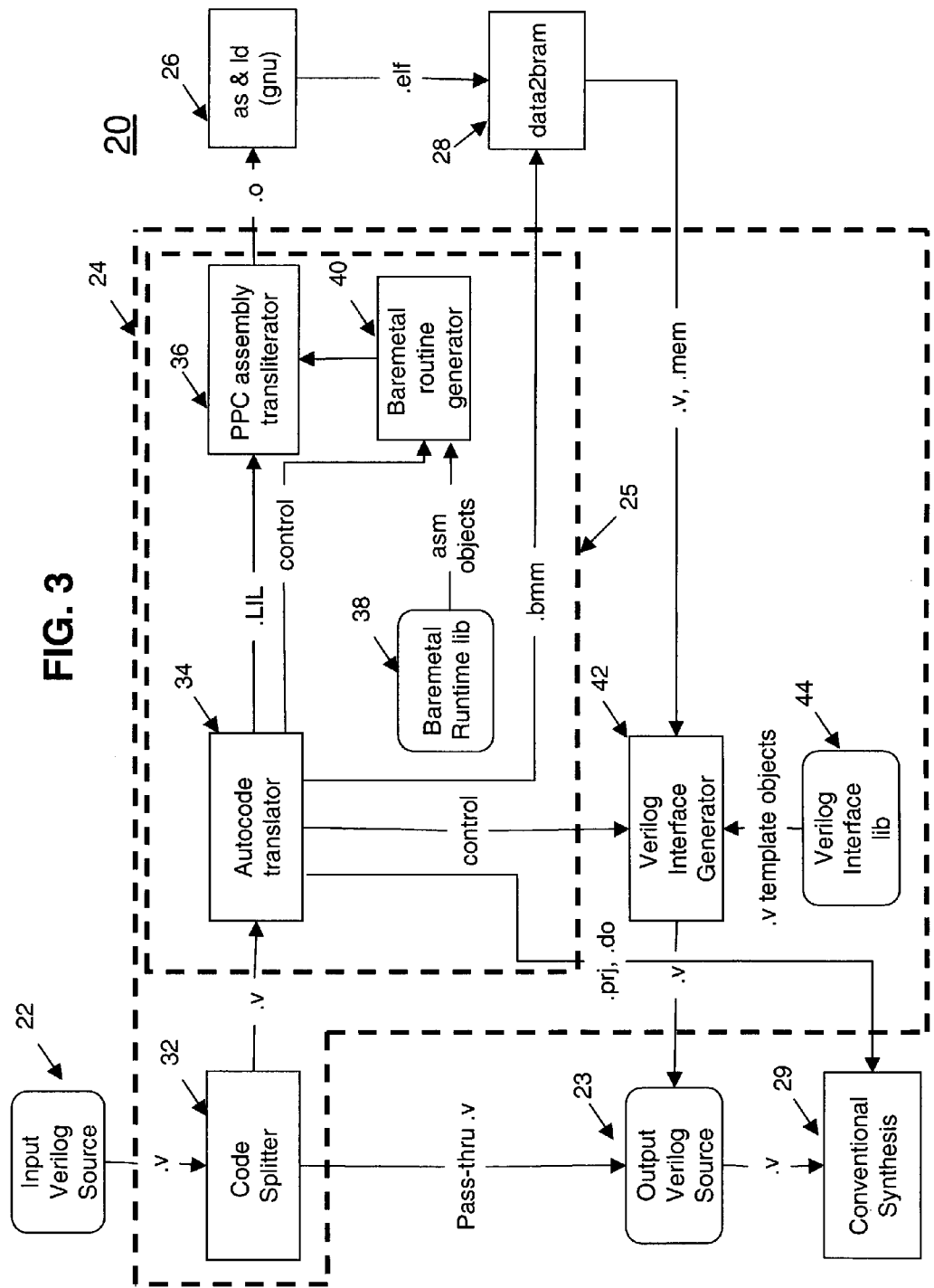
FIG. 3 depicts the process flow of a system for dynamic reconfigurable computing in accordance with the invention.

The code necessary for implementing the design of the FPGA-based SoC can be in a well known hardware description language (HDL). (NOTE: Traditional SoC designs are coded in C. The hardware is represented in HDL and the software portion in C.) HDL is a language used to describe the functions of an electronic circuit for documentation, simulation and/or logic synthesis. Verilog and VHSIC Hardware Description Language (VHDL) are standardized HDLs which are well known to those skilled in the art. Verilog and VHDL can be used to design electronic systems at the component, board, and system levels. They can facilitate the development of models at a very high level of abstraction. Other formats now known or to be discovered can also be used to represent the system model. When an FPGA-based SoC includes an embedded processor, such systems require the use of both a high-level programming language (or manually produced assembly language) and some kind of HDL to define the hardware in the FPGA. The present invention has an advantage of obviating the need to compile conventional programming languages (such as C) into HDL or lower level logic. The present invention benefits from the concurrency and parallel nature of such HDL coding as opposed to the conventional translation of serial code into a parallel hardware description. The present invention requires the translation of inherently parallel code into a serial result as illustrated by FIGS. 2 and 3. This translation process is significantly easier to produce and more likely to reflect correctly a user's intent.

Referring to FIG. 2, a user's view of a reconfigurable communication processor (RCP) 24 utilizing an automated microprogramming system 20 is shown. A block diagram of the process flow associated with RCP 24 is shown in FIG. 3. Input source code 22 such as Verilog HDL code is input into RCP 24. The RCP system logic is considered to have two parts, namely a spatially invariant portion represented by the FPGA fabric, and a temporally variant portion represented by the stored program for the microprocessor cores, such as a PowerPC core. A user would preferably create Verilog source code as two parts wherein the spatially invariant portion would be passed through directly as output Verilog source code 23 for synthesis in the FPGA fabric. The temporally variant portion would be translated directly into microprocessor assembly language for running on the microprocessor. The two portions are conjoined using a predefined interface generator 42. In other words, the present invention utilizes a translator 25, which performs automated microprogramming, and a generator 42, which autogenerates an FPGA fabric interface logic in order to provide a new way to deploy and use microprocessor cores in an FPGA domain.

Translator 25 preferably translates an HDL such as Verilog, which serves as the specification language for the hardware to be emulated in an embedded microprocessor. Note that the present invention is not a compiled code simulator, but rather teaches the direct emulation of logic (the hardware being emulated) via a stored program on an embedded microprocessor. As such, the microprocessor and its program are not operating as a simulator for hardware. In the exemplary invention, the emulator interacts as if it were logic with logic resources within the FPGA device that are outside of the microprocessor.

Similarly, while the software being described in the compiler part of the invention performs a function more like traditional HDL synthesis, it does not create logic (as via an EDIF netlist) for subsequent implementation using FPGA implementation tools. It is instead creating a program for the embedded microprocessor.

Additionally, because the Virtex-II Pro™ FPGA devices by Xilinx can contain more than one PowerPC microprocessor core, more than one instance of the application of the invention is possible. Hence, the invention provides a mechanism for automatically programming more than one microprocessor for concurrent operation and signal exchange with the FPGA logic fabric.

In particular, RCP 24 uses a code splitter 32 to split the code to be passed through from the code requiring translation. The code requiring translation preferably flows through a translator 25 that can include an autocode translator 34, and a microprocessor assembly transliterator 36. Autocode translator 34 can operate to control a baremetal routine generator 40 that utilizes a baremetal runtime library 38 to operate transliterator 36. Preferably, baremetal routine generator 40 creates an extremely minimal ("baremetal") runtime for the microprocessor. For example, baremetal routine generator 40 can aggregate distinct assembly language program fragments into a single static program that emulates logic. In so doing, no operating system or real time operating system (RTOS) of any kind is required, and no runtime stack or conventional heap data structure is required. Numerous advantages accrue from the manner of the technical problem being solved as disclosed herein. These advantages can be understood by considering in turn what happens at compile time, and what happens at runtime, for both software and hardware. The unusual hardware/software dichotomy of embodiments in accordance with the present invention will be explored in further detail below.

At compile time, according to an embodiment of the invention, HDL code is translated into assembly language for runtime on the embedded processor. Importantly, such translation results in a static program of fixed size, no matter what clustering of "hardware" functions is implied in the HDL. This is because once a given set of functions are specified, that hardware is ultimately spatially invariant. For example, if the translation were targeted to a specific hardware technology, a certain amount of space would be required, and more specifically, that space would be fixed. In exemplary embodiments in accordance with the invention, that hardware is emulated by software (created at compile time), and as such, it likewise has fixed "space," that is, the program requires a fixed amount of memory. Thus, every HDL translation (that fits within the available memory capacity) always results in a certain constant number of instruction words to emulate the hardware specified in the HDL.

This compile time situation results in wholly different runtime dynamics, in contrast with compilation of conventional programming languages. One fixed static program runs (as software) for every module of "hardware" the user designates for emulation by the embedded processor. There are no dynamic storage requirements on the processor at runtime. Advantageously, runtime software need only run a single program that repetitively cycles through static program code.

The runtime situation now invites new possibilities. Whole, separate static programs, each emulating a fixed statically-sized portion of hardware called out in an HDL specification, can be dynamically inserted into local memories to run on the embedded processor. This temporal dynamic happens only at runtime, and the embedded processor only needs to "wait" for a new program to be loaded, and then start execution of that new static program. Since there are no dynamic memory requirements, dynamic reconfiguration (by loading a new program) is easier to predict, handle, and schedule. External hardware in the FPGA fabric can direct the dynamic insertion of any number of such static programs, each previously translated at compile time. In this way, the invention enables dynamic reconfiguration using fixed static programs, each of which implements a holistic piece of emulated hardware of interest to the system design.

The principle of fixed-size program segments being temporally inserted into a memory for a stored program is a technique called "memory overlays." Overlays first originated for drum-memory computers of the 1950's, which had limited memory capacity with contingent timing requirements due to the rotation of the drum-memory storage device. However, in accordance with the invention, a "memory overlay" implements logic by emulation (where this emulated logic can interact with external hardware), and the rate of overlays can be dictated by external requirements, such as a network protocol, packet arrival rates, or a video frame rate. In an exemplary embodiment of the invention using Xilinx Virtex-II PRO FPGA devices, the embedded processor memory implementation can include CLB RAM or BRAMs (Block RAMs) located on the FPGA, or SDRAM, CompactFlash, hard disk, or other storage external to the FPGA devices.

An important aspect of the previously described dynamic reconfiguration process is that the rate of overlays can not only be controlled via logic within the FPGA fabric but external to the embedded processor (e.g., FPGA logic drives the processor, not the reverse), the rate can also be controlled such that the embedded processor can be up to 100% busy performing logic emulation. This contrasts with prior art dynamically reconfigurable systems in that the "overhead" for dynamic reconfiguration in exemplary embodiments in accordance with the invention can be as small as zero.

A further aspect of an exemplary embodiment of the invention is that the exchange of static fixed program data, which emulates logic, that occurs between a memory within or external to the FPGA device can occur in coordination with the instruction cache of the embedded processor. For example, an instruction cache read can occur as soon as the program code is initiated to start running. Once the program code is completely loaded, if the loaded code is smaller than or equal to the instruction cache size, the external memory can actually be subsequently unnecessary to the correct functioning of hardware emulated by the embedded processor, and hence can be dispensed with after loading.

As a result, for this situation, external hardware in the FPGA fabric can in fact consider dynamic reconfiguration as a facility that can be preprogrammed to occur "in the future," relative to the system operations of that hardware. In contrast to prior art dynamically reconfigurable systems comprised of FPGAs, the overhead for dynamic reconfiguration in the aforementioned case can be actually less than zero time (it can effectively be negative) because reconfiguration can occur in the future, relative to any stored program presently running on the embedded processor. Therefore, when constrained to use a number of memory words smaller than or equal to the instruction cache size, fixed static programs, which emulate hardware, effectively can be pipelined to overlay new static programs before they are needed. This is quite beneficial, for example, in 4G wireless applications, where a Quality of Service (QoS) estimate dynamically computed by the FPGA fabric can be used on a per-channel basis to pre-select one fixed static program at a time (from any convenient external storage), the selection occurring in advance of the time it is needed by the embedded processor.

In another aspect of an exemplary embodiment of the invention, compile time work (for creating usable runtime program images) does not have to be done on either the FPGA hardware or the embedded processor. This is because at compile time, the hardware (e.g., the FPGA and the embedded processor) is not required at all. At runtime, software running on the embedded processor only emulates logic, and nothing else. External hardware controls when and how to enable dynamic reconfiguration of memory overlays for the embedded processor.

To summarize several of the concepts discussed above, embodiments in accordance with the invention advantageously make the definitive use of certain key activities separately at compile time and runtime. The compile time and runtime boundaries are balanced in such a way that the embedded processor merely appears as a programmable logic element, despite its other conventional uses.

To understand further some of the novel aspects of the present invention, a more detailed comparison of what is meant by a "baremetal routine generator", a "baremetal runtime", and a "baremetal runtime library" as compared to a conventional runtime environment is provided. In existing embedded computer systems, especially those which embed a microprocessor on the same silicon device as programmable logic, some kind of software environment is provided. Such a software environment means that use of the microprocessor resources follows some predefined conventions and that certain libraries are available to provide at least minimal services locally. There are other related issues having to do with the linkage of programs, as well as the number and type of services. In most cases in the prior art, all of the services and capabilities are set up for the software requirements for a particular high-level language compiler such as a C or C++ language compiler, although others have been used. Taken as a whole, all these things are generically called the "runtime," or more particularly, "runtime environment".

A "baremetal runtime" does not follow a conventional "runtime environment" as described above. Instead, in the present invention, a microprocessor is made to perform the novel function of emulating hardware directly by running an assembly language program provided by a specialized compiler. The microprocessor is treated as a logic element, not as a conventional processor. The microprocessor itself is used directly, natively, without linkage to libraries for high-level languages. The microprocessor is viewed as a state machine that happens to use a conventional stored program as its representation. Thus, when HDL language used to describe the microprocessor is translated into assembly language, this translation can be considered "automated microprogramming."

A novel insight guiding the present invention is that hardware is spatially invariant, and, therefore, a computer program specifically designed to emulate hardware directly can mimic this important property, that is a computer program emulating hardware on an embedded processor is also spatially invariant in that it has fixed memory requirements. As a result, such a program does not require dynamic allocation of resources at runtime and does not need a runtime stack in software. Further, note that an emulator is not a simulator. Both an emulator and a simulator mimic the behavior of a system (or sub-system within a system). However, an emulator interacts directly with external hardware (or software) in a system, whereas a simulator is "offline," and does not. Moreover, the present invention does not simulate Verilog or a hardware description language. Rather, it uses a stored program to emulate logic that was originally specified in Verilog, or another HDL language.

More specifically, the logic emulated by a program running on a microprocessor core will interact and exchange signals with other logic within an FPGA fabric. Implementing logic using an emulator (program) has a host of implications which impact runtime efficiency positively in ways that simulators cannot achieve. One important insight here is that "hardware" is basically spatially invariant, so that the runtime does not need dynamic storage management, among other basic software tasks. Again, this kind of runtime is very different than that of typical compiled languages because it does not require a stack or a heap. All memory is allocated statically at compile time, and all code is similarly apportioned.

The virtue of using a standard HDL for system specification that includes a part automatically compiled for the embedded processor can now be seen: this HDL code can be simulated by conventional means, and then implemented on the embedded processor only after shown to be functionally correct through the conventional simulation methods. This means that the HDL code intended for translation can always be considered functionally correct, and as such, the embedded processor running the translated code is emulating, and not simulating, hardware. The emulation of hardware described herein means the emulated hardware is always "online," and interactively exchanging signals with the FPGA fabric using binary logic states only. In contrast, a simulator is "offline," and must deal with unknown and uninitialized states for logic, and does not directly participate with hardware signal exchanges as a running program. It also advantageous that the present invention is not running a conventional HDL simulator created through conventional compilation means. Implementing a conventional simulator on the embedded processor would require dynamic software resources, such as resources conventionally supported by C++, and also a larger runtime program size. In contrast, exemplary embodiments of the present invention load a fixed static assembly language program that is emulating a proven correct hardware design and does not require dynamic resources.

A "baremetal runtime library" refers to a library of procedures accessible to the compiler for convenience in creating the stored program to emulate hardware. This library differs from the conventional concept of libraries in that it is not compiled from a high-level language, it does not link to a high-level language, and it does not require processor-managed dynamic allocation of memory.

The "baremetal routine generator" is a part of the compiler that provides the necessary stored program to emulate hardware using algorithmic means, rather than by sheer lookup means, as is the case with the "baremetal runtime library," above. The "baremetal routine generator" and "baremetal runtime library" form complementary assets comprising the means by which the assembly language program is created according to the invention.

After the translation by translator 25, well known software tools 26 and 28 can properly format the data for the appropriate processor and FPGA utilized before an FPGA fabric interface logic generator 42 using an HDL interface library 44 autogenerates an appropriate logic interface.

Software tools 26 and 28 can include GNU and Data2BRAM software tools. Data2BRAM was created to incorporate CPU software images into FPGA bitstreams conveniently, and to execute that software from block RAM-built address space. Data2BRAM currently works well in combinations of Virtex™ series FPGA devices from Xilinx with 32-bit CPUs on a single chip such as a Virtex-II Pro™ device. The Data2BRAM software tool has taken a complicated process and significantly simplified the process to affect existing tool flows as little as possible, for both FPGA and CPU designers. In one embodiment, Data2BRAM currently supports the Virtex and Spartan device families available from Xilinx.

The present invention could also use other embedded software tools particularly designed from given FPGA platforms. The term "embedded software tools" most often applies to the tools required to create, edit, compile, link, load, and debug high level language code, usually C or C++, for execution on a processor engine. For example, with the Virtex-II Pro™ Platform FPGA by Xilinx, engineers will be able to target design modules for either silicon hardware (FPGA gates) or as software applications, run on process engines such as the embedded PowerPC hard core.

Xilinx supports the Virtex-II Pro™ Platform FPGA embedded processors with "Xilinx versions" of established tools but the present invention should not be limited to such platforms or tools. The present invention accommodates hardware centric engineers who want to innovate by moving design modules into software run on an FPGA PowerPC core for example and likewise accommodates software centric engineers wanting a feature-rich environment for developing more complex applications using specialized best-of-class tools. The present invention alleviates the issue of design engineers having to embrace completely new development methodologies while allowing them to port existing legacy designs to an FPGA platform.

For instance, Xilinx has created a specific version of the popular GNU compiler/debugger tool chain for the Virtex-II Pro™ Platform FPGA. This tool currently allows Xilinx to support software design for the IBM PPC405 hard core processor with one tool chain technology. In particular, the Xilinx GNU tools can include:

GCC—GNU Compiler (Xilinx Virtex-II Pro™ Platform FPGA specific)

GDB—GNU Software Debugger (Xilinx Virtex-II Pro™ Platform FPGA specific)

Parallel Cable IV—Xilinx JTAG Run Control Hardware Connection Probe

In any event, once the code is appropriately formatted using the tools, FPGA fabric interface logic generator 42, using HDL interface library 44, autogenerates the appropriate logic interface to conjoin the HDL code passed through defining the FPGA fabric with the HDL code translated for the appropriate microprocessor core into an output HDL (or Verilog) source 23 forming the predefined microprocessor/fabric interface. This combined HDL source code is then synthesized (29) in the conventional manner and ultimately implemented in an FPGA.

Creating the assembly language program for one or more microprocessors is done separately, which allows the synthesis of the system to be a conventional synthesis task. The program created for the microprocessor is merely data for an embedded memory on the FPGA fabric where the memory itself is merely an instance of a library element for the target FPGA, just like the microprocessor core. Thus, the output of the compiler (e.g. data for a memory), the memory, combined with the pre-defined interface and the microprocessor core as an instance is joined with the code split away from compilation into assembly language. This aggregate forms nothing more than a conventional HDL synthesis task for conventional tools such as Xilinx's ISE 5.2 software. Thus, the present invention achieves automatic software programming of the microprocessor cores in a context for convention hardware synthesis via HDL.

The predefined microprocessor/fabric interface is a way of describing (in the exemplary case) a Verilog module which acts as the gateway between logic implemented on the FPGA device fabric and logic implemented in the microprocessor, with attention to the particulars of the wiring of the interface. This concept is known in the art as a "black box interface," and is used with HDL libraries that match to physical primitives for a particular silicon technology. In the present invention, something very similar is used to allow user-selective delineation between which hardware is to be implemented in the FPGA fabric versus on the embedded microprocessor core via the novel means of the invention. This delineation in the exemplary case means excerpting certain Verilog code not destined for implementation on the microprocessor core away from Verilog code that will be implemented on the microprocessor core. In essence, this creates a boundary that demarcates between such sets of Verilog source code. Hence, it is also particularly advantageous that a User may chose a part of the HDL code to implement with the system and methods disclosed herein, rather than relying upon the software automata of a compiler to make a system partitioning automatically.

In light of the foregoing description of the invention, it should be recognized that the present invention can be realized in hardware, software, or a combination of hardware and software. A method and system for dynamic reconfigurable computing of a system having at least one microprocessor implemented on a field programmable gate array according to the present invention can be realized in a centralized fashion in one computer system, or in a distributed fashion where different elements are spread across several interconnected processing modules. A typical combination of hardware and software can be a general purpose computer system with a computer program that, when loaded and executed, controls the computer system such that it carries out the invention described herein.

The present invention can also be embedded in a computer program product that comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following: a) conversion to another language, code or notation; and b) reproduction in a different material form.

Additionally, the description above is intended by way of example only and is not intended to limit the present invention in any way, except as set forth in the following claims.

What is claimed is:

1. A system comprising:
   an integrated circuit comprising a microprocessor and programmable fabric; and
   a translator for generating description language for programming both the microprocessor and the programmable fabric, wherein the microprocessor uses a bare-metal runtime.

2. The system of claim 1, further comprising a predefined interface for exchanging signals between the programmable fabric and the microprocessor.

3. The system of claim 1, further comprising an automatic microprogram generator for the microprocessor that provides control over a stored program in the microprocessor.

4. The system of claim 1, wherein the microprocessor comprises a PowerPC microprocessor.

5. The system of claim 1, wherein the description language is Verilog.

6. A system for designing a dynamic reconfigurable processor, comprising:
- an integrated circuit comprising a microprocessor and programmable fabric;
- a translator for automatically translating hardware description language code defining the microprocessor into assembly language;
- software tools for converting said assembly language into hardware description language combinable with hardware description language code defining the programmable fabric;
- a predefined hardware description language interface between the microprocessor and the programmable fabric.

7. The system of claim 6, further comprising a baremetal routine generator, wherein the translator controls the baremetal routine generator to generate a program for emulating logic.

8. The system of claim 6, wherein the baremetal routine generator utilizes a baremetal runtime library.

9. The system of claim 6, wherein the microprocessor comprises a PowerPC microprocessor.

10. The system of claim 6, wherein the hardware description language is Verilog.

11. A method for dynamic reconfigurable computing of a system having at least one microprocessor and a programmable fabric, comprising the steps of:
- splitting hardware description language source code used in defining the system between source code for the programmable fabric and source code for the at least one microprocessor;
- automatically translating the source code for the at least one microprocessor to provide translated source code; and
- combining said translated source code with the source code from the programmable fabric to provide a combined source code.

12. The method of claim 11, wherein the method further comprises a step of synthesizing the combined source code.

13. The method of claim 11, wherein the step of automatically translating comprises a step of translating the source code for the at least one microprocessor into assembly language using a baremetal routine generator.

14. The method of claim 11, wherein the step of combining comprises a step of automatically generating an interface between the programmable fabric and the at least one microprocessor to provide signal exchange between the programmable fabric and the at least one microprocessor.

15. The method of claim 11, further comprising the steps of:
- changing the source code for the at least one microprocessor; and
- automatically translating the changed source code for the at least one microprocessor.

16. The method of claim 15, further comprising the steps of:
- configuring the programmable fabric with the combined source code; and
- reconfiguring the programmable fabric with the translated changed source code.

17. The method of claim 16, wherein the step of reconfiguring comprises using a memory overlay.

18. A system for dynamic reconfigurable computing comprising:
- at least one microprocessor;
- a programmable fabric; and
- a translator enabling a hardware description language to define the system, including both the at least one microprocessor and the programmable fabric, wherein the translator generates a baremetal runtime from the hardware description language for execution on the at least one microprocessor.

19. The system of claim 18 further comprising a predefined interface between the at least one microprocessor and the programmable fabric.

* * * * *